United States Patent [19]
Van Berkel et al.

[11] Patent Number: 5,349,174
[45] Date of Patent: Sep. 20, 1994

[54] IMAGE SENSOR WITH TRANSPARENT CAPACITIVE REGIONS

[75] Inventors: Cornelis Van Berkel, Brighton; Neil C. Bird, Horley; Oliver S. Davies, Reigate; Martin J. Edwards, Crawley; John M. Shannon, Whyteleafe; Alan G. Knapp, Crawley, all of England

[73] Assignee: U.S. Philips Corporation, New York, N.Y.

[21] Appl. No.: 46,415

[22] Filed: Apr. 12, 1993

[30] Foreign Application Priority Data

May 6, 1992 [GB] United Kingdom .............. 9209734.4

[51] Int. Cl.⁵ ............................................ H01J 40/14
[52] U.S. Cl. .................................. 250/208.1; 257/443
[58] Field of Search ................... 250/208.1, 214.1; 257/443, 444, 446, 447, 448

[56] References Cited

U.S. PATENT DOCUMENTS 3,862,360  1/1975  Dill et al. .
4,388,532  4/1981  Garcia ............................... 250/208.1
4,448,491  8/1980  Okubo ................................. 257/443

FOREIGN PATENT DOCUMENTS 0233104  1/1987  European Pat. Off. .
0234968  1/1987  European Pat. Off. .
0217960  6/1988  European Pat. Off. .
0319403  6/1989  European Pat. Off. .
8909960 10/1989  PCT Int'l Appl. .
2198869  8/1990  United Kingdom .

OTHER PUBLICATIONS

B. J. Lechner et al., "Liquid Crystal Matrix Displays", Proceedings of the IEEE, vol. 59, No. 11, Nov. 1971, pp. 1566–1579.

Primary Examiner—David C. Nelms
Attorney, Agent, or Firm—Edward W. Goodman

[57] ABSTRACT

The image sensor (1a) has a transparent substrate (2) supporting a two dimensional array (3) of photosensitive and switching elements (4) with switching signal conductors (5) and data signal conductors (6) connected to the photosensitive and switching elements (4) for enabling individual photosensitive elements to be accessed. The photosensitive and switching elements (4) and the conductors (5 and 6) are arranged such that at least half of the area of the image sensor is transparent during operation. Each photosensitive element is electrically coupled to a respective capacitor (7) for storing charge generated as a result of light being incident on the photosensitive element. The capacitors (7) are formed so as to be transparent and so as to occupy a significant part of the entire area of the array (3). The transparent capacitors act effectively to increase the sensitivity of the photosensitive elements by enabling a high quantity of charge to be stored in response to light incident on the photosensitive elements so enabling the photosensitive elements (4) to be quite small while still providing sufficient signal to enable high accuracy in the sensing of an image.

14 Claims, 7 Drawing Sheets

IMAGE SENSOR WITH TRANSPARENT CAPACITIVE REGIONS

BACKGROUND OF THE INVENTION

1. Field of the Invention

This invention relates to an image sensor comprising a transparent substrate supporting a two dimensional array of photosensitive and switching elements and switching signal conductors and data signal conductors connected to the photosensitive and switching elements for enabling individual photosensitive elements to be accessed, the photosensitive and switching elements and conductors being arranged such that at least half of the area of the image sensor is transparent during operation.

2. Description of the Related Art

Such an image sensor is described in EP-A-378593 (International Publication No. WO 89/09960). The image sensor described in that document has a matrix array of photosensitive diodes connected back to back with switching diodes between row and column conductors. Each photosensitive diode may be formed on top of the associated switching diode. The image sensor is designed to be placed on top of, for example, an electro-optic display which requires the image sensor to be sufficiently transparent that the image produced by the display is still identifiable when viewed through the image sensor. As indicated in the document, the photosensitive diodes are designed to occupy equal to or less than 50% of the surface area of the image sensor. Clearly, the smaller the area occupied by the photosensitive diodes the better the view of the display image which can be obtained through the image sensor. However, the light collection efficiency of the photosensitive diodes reduces with area. It is accordingly necessary to accept a compromise between the dynamic range (that is the detection limit or number of gray scale levels which can be detected under a given illumination level) of the image sensor and the degree of obscuration of the display device.

SUMMARY OF THE INVENTION

It is an aim of the present invention to provide an image sensor which is highly transparent but which also has a good dynamic range to enable efficient image detection.

According to a first aspect of the present invention, there is provided an image sensor comprising a transparent substrate supporting a two dimensional array of photosensitive and switching elements with switching signal conductors and data signal conductors connected to the photosensitive and switching elements for enabling individual photosensitive elements to be accessed, the photosensitive and switching elements and conductors being arranged such that at least half of the area of the image sensor is transparent during operation, characterized in that each photosensitive element is electrically coupled to a respective capacitor for storing charge generated as a result of light being incident on the photosensitive element, the capacitors being formed so as to be transparent and so as to occupy a significant part of the entire area of the array.

As used herein the term 'light' normal means electromagnetic radiation visible to the human eye but could be applied, by the use of appropriate materials to form the photosensitive elements, to electromagnetic radiation in, for example, the near infra-red and the term 'transparent' means that the material concerned absorbs very little, for example less than about 20%, of the light incident thereon.

Thus, by storing charge generated as a result of light being incident on the photosensitive elements, the transparent capacitors act effectively to increase the dynamic range of the photosensitive elements by enabling a high quantity of charge to be stored in response to light incident on the photosensitive elements. The light capturing area of the photosensitive elements can therefore be quite small while still providing sufficient signal to enable high accuracy in the sensing of an image. The array may be, for example, up to about 90% transparent enabling it to be provided over, probably in contact with, a display device (which may be a cathode ray tube or other form of electro-optic display device such as a liquid crystal display device) without the image sensor unduly interfering with the image projected by the display device during its normal use. Where at least the switching signal conductors are opaque, the photosensitive elements may be shielded from the transparent substrate by the switching signal conductors. Thus, the photosensitive elements may be provided on top of the opaque switching signal conductors which reduces the area of the image sensor occupied by non-transparent components while shielding the photosensitive elements from light directed at the substrate for example from an electro-optic display on which the image sensor is mounted.

Two or more photosensitive elements may be associated with the same pair of switching signal and data signal conductors and arranged to have different switching signal thresholds, for example by being associated with switching elements with different switching thresholds, so that the two or more photosensitive elements can be accessed separately by applying different threshold switching signals to the switching signal conductor.

In another aspect, the present invention provides an image sensor comprising a transparent substrate supporting a two dimensional array of photosensitive and switching elements and switching signal conductors and data signal conductors connected to the photosensitive and switching elements for enabling individual photosensitive elements to be accessed, the photosensitive and switching elements and conductors being arranged such that a substantial part for example at least about half, of the area of the image sensor is transparent, the switching signal conductors being opaque and the photosensitive and switching elements being provided on the switching signal conductors so as to be shielded from the transparent substrate characterized in that two or more photosensitive elements are associated with the same pair of switching signal and data signal conductors and are arranged to have different switching signal thresholds so that the two or more photosensitive elements can be accessed separately by applying different threshold switching signals to the switching signal conductor.

This enables the number of conductors to be reduced with respect to the number of photosensitive elements which should enable a greater area of the image sensor to be transparent whilst still achieving the same or similar resolution. Where the image sensor is to be provided on top of an active matrix-addressed electro-optic display this should enable tile image sensor to have the same number of switching signal and data conductors as the display, so allowing the switching signal and data conductors of the image sensor to be aligned with the corresponding conductors of the display device and in particular with any mask used to shield the display switching elements from incident light. This should allow minimum, if any, obscuration of the display image by the image sensor while allowing the image sensor to have a higher resolution than the display. This should enable the image sensor to be able to sense or read text and should allow for optical character recognition with appropriate circuitry and software.

Each switching element may comprise a diode or a number of series-connected diodes. In another example each switching element may comprise an insulated gate field effect transistor and the transistors associated with different ones of the two or more photosensitive elements may have different threshold voltages by, for example, providing a respective voltage-adjusting element between the gate electrode of the transistor and the switching signal conductor.

The present invention also provides a method of forming a color image sensor which method comprises providing an image sensor in accordance with the first aspect of the invention on a color display device, for example a liquid crystal display device, activating the color display device so as to illuminate an image being sensed by the image sensor sequentially with three different colors of light, reading out sets of signals from the image sensor representing the image as sensed under each different color illumination and combining the three sets of signals to produce a set of composite signals representing the full color image.

With such an arrangement there is no need to provide color filters within the image sensor and the image sensor can be adapted for color image sensing simply by combining it with a conventional color display. Although a Cathode Ray tube (CRT) display device could be used, the use of a color active matrix addressed display device has advantages because such a display is flat and compact allowing for formation of an easily portable device.

Any suitable three 'colors' of light may be used for example the three primary (red, green and blue) or the three complementary (cyan, magenta and yellow) may be used. As a possible alternative one of the colors of light may be white light and the other two may be any selected two of the complementary colors).

BRIEF DESCRIPTION OF THE DRAWINGS

Embodiments of the invention will now be described, by way of example, with reference to the accompanying drawings, in which.

Figure 1:
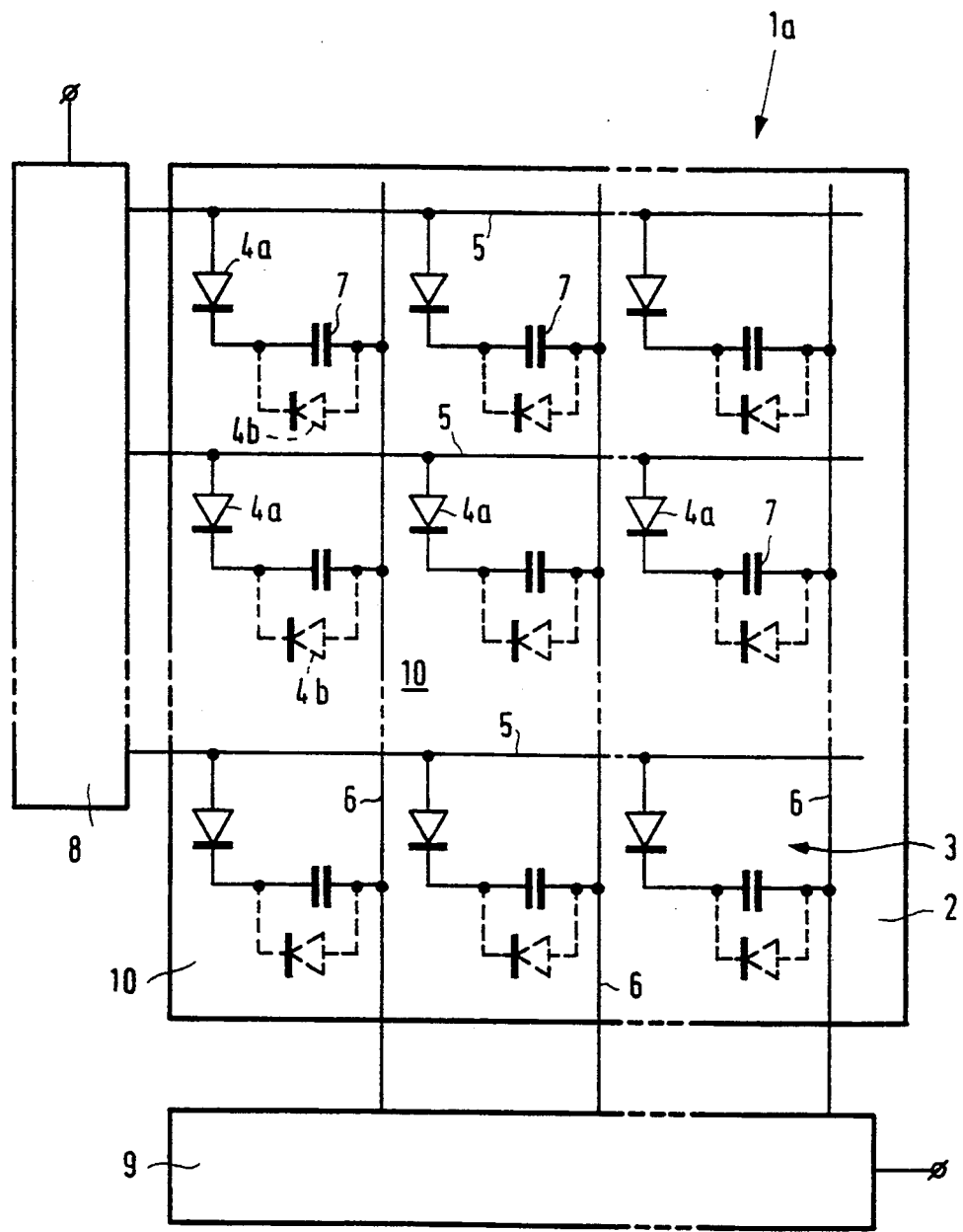
FIG. 1 is a schematic circuit layout of one example of an image sensor in accordance with the invention.

It should of course be understood that the drawings are merely schematic and are not to scale, for example various dimensions, such as the thickness of layers, may have been relatively exaggerated in the interests of clarity.

DESCRIPTION OF PREFERRED EMBODIMENT

Referring now to the drawings, there are illustrated various examples of image sensors in accordance with the invention. In each case, the image sensor 1a, 1b, 1c or 1d comprises a transparent substrate 2 supporting a two dimensional array 3 of photosensitive and switching elements 4 with switching signal conductors 5 and data signal conductors 6 connected to the photosensitive and switching elements 4 for enabling individual photosensitive elements to be accessed, the photosensitive and switching elements 4 and the conductors 5 and 6 being arranged such that at least half of the area of the image sensor is transparent during operation.

In accordance with the invention, each photosensitive element is electrically coupled to a respective capacitor 7 for storing charge generated as a result of light being incident on the photosensitive element, the capacitors 7 being formed so as to be transparent and so as to occupy a significant part of the entire area of the array 3, where the term 'significant part' should be understood to mean at least 10% and preferably 50% or more of the area not occupied by the switching signal and data signal conductors 5 and 6.

By storing charge generated as a result of light being incident on the photosensitive elements 4a, the transparent capacitors act effectively to increase the sensitivity of the photosensitive elements by enabling a high quantity of charge to be stored in response to light incident on the photosensitive elements. This means that the light capturing area of the photosensitive elements 4 can be quite small while still providing sufficient signal to enable high accuracy in the sensing of an image. The array may be, for example, up to about 90% transparent enabling it to be provided over, probably in contact with, a display device which may be a cathode ray tube or other form of electro optic display device such as a liquid crystal display device, without the image sensor unduly interfering with the image projected by the display device during its normal use.

Such an image sensor may be used, for example, to enable a contact image to be obtained merely by placing the document to be imaged onto the top of the combined display and image sensor. The image of the document may then be displayed by use of conventional electronic and video circuitry to transfer the stored image directly to the display device. As another example, the image sensor may be used to enable a light pen or similar device to be used to 'write' onto the display of a conventional cathode ray tube or liquid crystal display device.

FIG. 1 is a schematic circuit layout of one example of an image sensor 1a in accordance with the invention.

In the example illustrated in FIG. 1, the array 3 may have an overall size of up to 400 by 400 mm with a pitch between adjacent photosensitive and switching elements of about 200 μm. For convenience only part of the array 3 is shown in full. Each photosensitive element may be a diode, generally a p-i-n diode, which may also form the switching element. This diode is given the reference numeral 4 in FIG. 1. In this case each photosensitive and switching element 4a is connected in series with the capacitor 7 between a switching signal or row conductor 5 and a data signal or column conductor 6 so that each photosensitive and switching element 4a is associated with a unique pairing of row and column conductors 5 and 6 enabling each photosensitive element 4 to be accessed individually.

As illustrated in FIG. 1 the row and column conductors 5 and 6 are arranged in a matrix of 1-m rows and 1-n columns (only three rows and columns being shown). The row conductors 5 are connected to a row driver or decoder/addressing circuit 8 while the column conductors 6 are connected including a charge-sensitive read-out amplifier arrangement 9 which may be of conventional type. A read-out arrangement of the type described in EP-A-440282, corresponding to U.S. Pat. No. 5,184,018, could also be used.

The matrix array of row and column conductors 5 and 6 defines a grid of image areas 10 each of which is bounded by two adjacent pairs of intersecting row and column conductors 5 and 6. In the example illustrated in FIG. 1, each image area 10 is associated with a single photosensitive and switching element 4a.

In the example of FIG. 1, each photosensitive and switching element 4a is reverse-biassed by appropriate switching signals on the row conductors 5 in order to enable sensing of an image so as to allow charge to be stored on the associated capacitor 7. Each photosensitive and switching element 4a may then be forward-biassed in succession to enable the charge stored in the associated capacitor 7 to be read-out. Systems for addressing individual photosensitive elements and reading the charge (data) stored thereat are well known to the image sensing art (see for example EP-A-233104, EP-A-234968) and have derived, for example, from the active matrix addressing systems used for electro-optic, in particular LCD, displays. Accordingly, the details of the addressing and reading systems will not be given.

Figure 2:
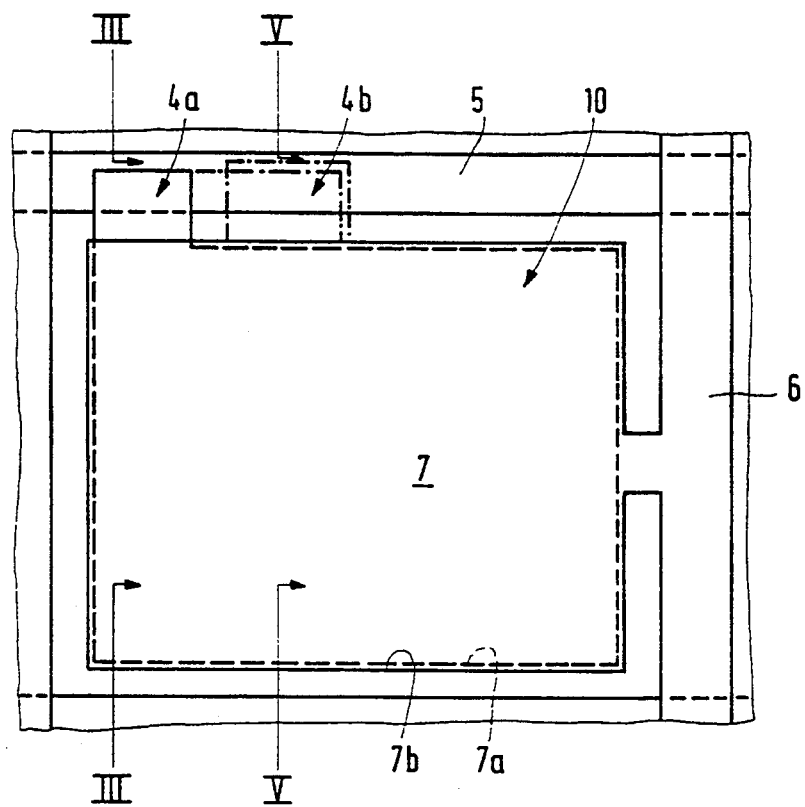
FIG. 2 is a schematic plan view of part of the image sensor shown in FIG. 1 but illustrating only the conductive levels so as to show the geometric relationship between various components.

FIG. 2 illustrates very schematically a plan view of the top conductive levels of an image area 10 of the image sensor 1a together with at least parts of the row and column conductors 5 and 6 bounding the image area. The area of the photosensitive and switch element is indicated by the appropriate reference numeral in FIG. 3 which is a cross-section along the line III—III of the image area 10 shown in FIG. 2.

In this example the transparent substrate 2 is formed of glass, although other materials even flexible materials such as suitable plastics materials could be used. The image sensor 1a is formed upon the transparent substrate 2 using conventional thin film processing techniques. Thus, in this case, the row conductors 5 are first formed by depositing and patterning a layer of a suitable opaque electrically conductive material, in this example chrome. The photosensitive and switching elements 4a are then formed as, preferably, n-i-p (with the p conductivity layer adjacent the chromium row conductors 5) diodes, although p-i-n diodes could be used, by depositing and then patterning appropriately doped layers 40, 41 and 42 of, in this example, amorphous silicon. An insulating layer 11, for example of silicon oxide or silicon nitride, is then deposited and patterned to form a window to enable contact to be made to the diodes 4a.

A layer of a transparent electrically conductive material, generally indium tin oxide, is then deposited and patterned to define the top contacts 12 to the diodes 4. The top contact 12 of each diode 4 is formed integrally with the bottom transparent electrode 7a of the associated capacitor 7. A layer 13 of a transparent insulating material, such as silicon oxide or silicon nitride, is then deposited to form the capacitor dielectric followed by a layer of a transparent electrically conductive material, again generally indium tin oxide, which is patterned to define the top electrodes 7b of the capacitors 7 and the column conductors 6. The conductivity of the column conductors 6 may, if necessary, be increased by depositing and patterning, for example, an aluminium layer so as to provide a composite structure for the column electrodes 6. The completed structure is generally be covered by a protective transparent insulating layer 14 such as a layer of polyimide.

Figure 3:
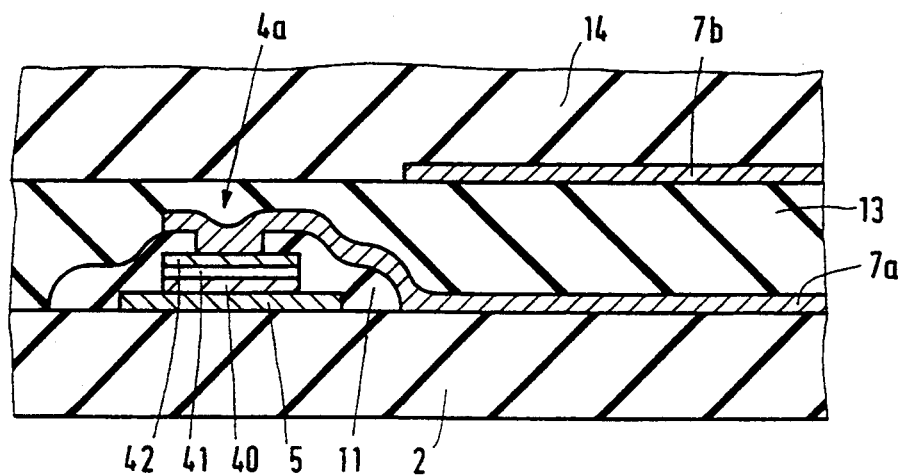
FIG. 3 is a cross-sectional view of part of the image sensor shown in FIG. 1 taken along line III—III in FIG. 2.

As indicated schematically in FIGS. 2 and 3, the transparent capacitors 7 occupy a significant part of the image areas 10. Depending upon the particular application, the capacitors may have a capacitance in the range of from about 0.1 to about 5pF (picofarads). The actual proportion of each image area 10 occupied by the capacitor 7 will generally be most dependent on the pixel pitch (that is the distance between the centers of adjacent image areas 10) because it is likely that similar capacitances will be required even if the pixel pitches are different. Thus, for example, where the pixel pitch is about 0.1 mm (millimeters) then the capacitor 7 might occupy between 50% and 100% of the area 10 not occupied by the conductors 5 and 6, while where the pixel pitch is about 0.2 mm then the part of the area 10 occupied by the capacitors 7 may fall to 10% to 20% for a similar capacitance although, of course, larger capacitances could be used. It will be appreciated that, although the use of extremely large area, (for example occupying 80% to 100% of the image area 10 as shown in FIGS. 2 and 3) may be advantageous in further increasing the dynamic range, even materials such as indium tin oxide (ITO) absorb a small amount of light and thus reduce the transparency of the device. In addition, the larger the area of the capacitors, the more likely is the possibility of short-circuits due to pin-hole defects.

The photosensitive and switching elements 4a are provided on top of the opaque row conductors 5 which has the advantages of automatically shielding the photosensitive and switching elements 4a from light transmitted through the substrate 2 towards the photosensitive and switching elements 4a and in addition means that the photosensitive element (which of course must absorb the light to be sensed and cannot therefore be transparent) is provided on an area of the image sensor 1a which is already opaque. Accordingly, the amount of the image sensor 1a area which is opaque need not in any way affected by the presence of the photosensitive and switching elements 4a. Typically, as much as 90% of the entire area of the image sensor 1a may be transparent.

Figure 4:
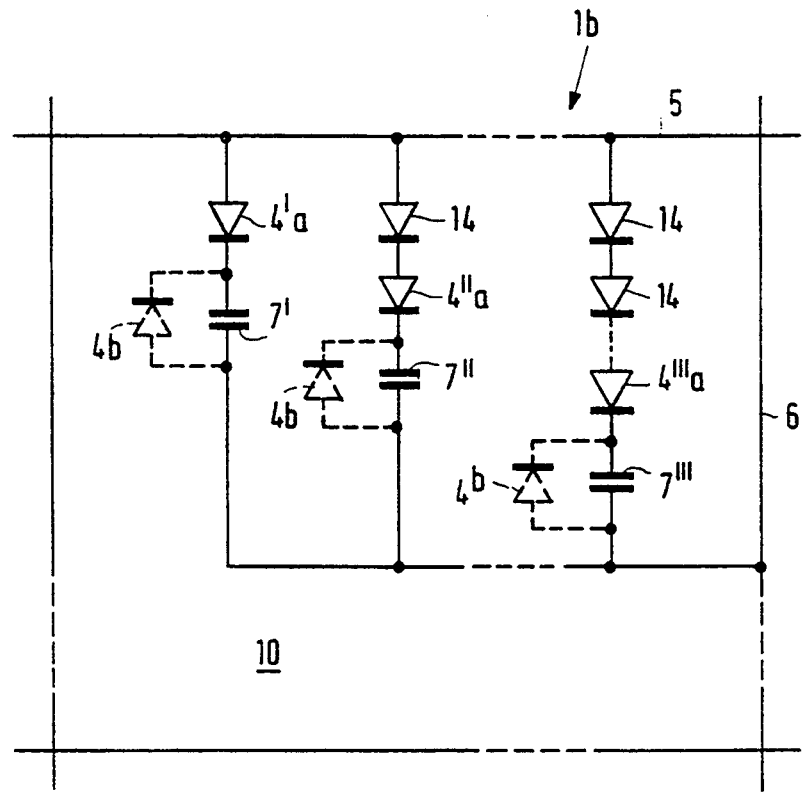
FIG. 4 is a schematic circuit layout of one image area of a modified version of the image sensor shown in FIG. 1.

FIG. 4 is a circuit layout of one image area 10 for illustrating a modification of the circuit shown in FIG. 1 which enables an even greater proportion of the area of the image sensor to be transparent.

In the image sensor 1b illustrated by way of the single image area 10 in FIG. 4, a number of photosensitive and switching elements 4 are associated with the same pair of row and column conductors 5 and 6. In order to enable individual ones of the photosensitive and switching elements 4a to be accessed, threshold adjusting devices 14 are provided so that a different level of switching signal is required on the row conductor 5 to access different ones of the photosensitive elements associated with the same pair of row and column conductors 5 and 6. In the example shown in FIG. 4, the threshold adjusting devices 14 are in the form of additional diodes connected in series with the diodes forming the photosensitive and switching elements 4a. As shown in FIG. 4, three photosensitive and switching element diodes 4a are associated with the same pair of row and column conductors 5 and 6, although as indicated by tile broken lines, more (or fewer) photosensitive and switching elements 5 and 6 could be associated with each image area 10.

The number of series-connected additional diodes 14 used to adjust the threshold voltage at which a given photosensitive diode 4a can be accessed will of course depend on the characteristics of the threshold adjusting diodes 14 and the switching signal voltage levels which are available.

The threshold adjusting diodes 14 may be formed on the opaque row conductors 5 in a similar manner to the photosensitive diodes 4a. The threshold adjusting diodes 14 need of course to be shielded from the light to be detected by the photosensitive diodes 4a. This may be achieved by forming the respective photosensitive diode 4 on top of the associated threshold adjusting diode or diode stack 14 or by providing an opaque (generally chromium) top contact for the threshold adjusting diodes 14.

The separate capacitors 7', 7" and 7''' in the example shown in FIG. 4 may be formed quite simply by patterning of the indium tin oxide layers in appropriate manner to define, in this case, three discrete capacitors of any desired geometry in each image area 10. The separate capacitors 7', 7" and 7''' may all be of the same or similar size so that each provides a similar value signal, thereby simplifying processing. Alternatively, the separate capacitors 7', 7" and 7''' may have significantly different areas (and thus capacitances) which may facilitate identification of the particular capacitor supplying a signal, at the expense of further processing circuitry. In particular the capacitor 7' may be smaller than the capacitor 7" which may in turn be smaller than the capacitor 7'''. This may assist in ensuring that, when its signal is readout, each capacitor is fully discharged before the signal is read from the next higher threshold subsidiary pixel.

An image sensor 1b having image areas 10 with the structure shown in FIG. 4 has the additional advantage that, as a unique pair of row and column conductors 5 and 6 is not necessary for each photosensitive and switching element the same degree of image resolution (pixel pitch) can be achieved with less, or more widely separated, row and column conductors 5 and 6, thereby reducing the amount of the area of the image sensor 1b taken up by the opaque conductors 5 and 6 and so allowing a larger area of the image sensor 1b to be transparent.

In the examples described above, the photosensitive and switching elements are provided by a single photosensitive diode 4a. However, the photosensitive elements may be separated from the switching elements. In such a case, the photosensitive elements do not need to have a switching capability and could be for example photosensitive resistors.

Figure 5:
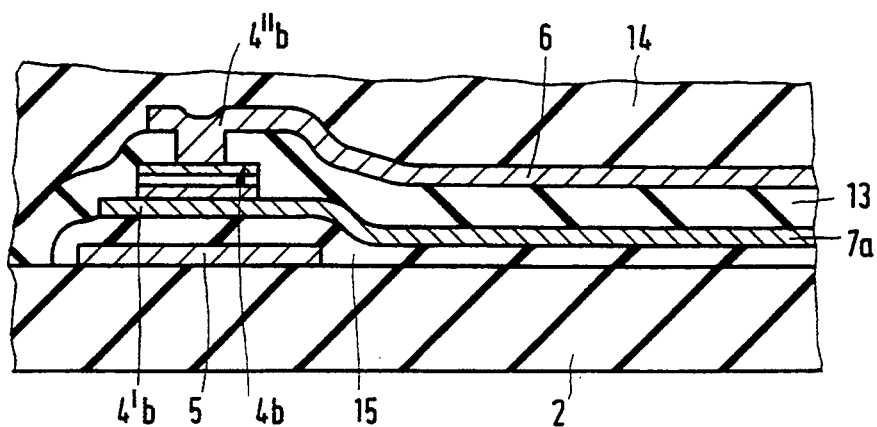
FIG. 5 is a cross-sectional view of part of a modified version of the image sensor shown in FIG. 1 taken along the line V—V in FIG. 2.

FIGS. 1 and 4 illustrate in phantom lines the use of a separate photosensitive element 4b. As shown, the photosensitive element is a photosensitive diode 4b arranged in parallel with the associated capacitor 7. This photosensitive diode 4b is indicated by dashed lines in FIG. 4. FIG. 5 illustrates a possible structure for such a photosensitive diode 4b. As can be seen from FIG. 5, the photosensitive diode 4b has a similar structure to that shown in FIG. 3 for the combined photosensitive and switching diode 4a except that, of course, the photosensitive diode 4b is electrically isolated from the opaque row conductor 5 by an insulating layer 15 and the indium tin oxide layers providing the bottom and top electrodes 7a and 7b of the capacitor 7 are patterned so as to define the bottom and top electrodes 4'b and 4"b, respectively, of the photosensitive diode 4b.

In this case, the other diode labelled 4a in FIGS. 1 and 4 is not intended to be photosensitive and should be shielded from the light incident on the image sensor in a manner similar to that described above in relation to the threshold adjusting diodes 14.

Although the switching element and threshold adjusting diodes 4a and 14 have been described above as being p-i-n diodes, other types of diodes, for example thin-film Schottky diodes or other non-linear switching elements such as MIM devices may be used. Where such devices can be made to have sufficient photosensitivity they could also be used as the photosensitive elements, either as the separate photosensitive elements 4b (shown in dashed lines in FIGS. 1 and 4) or as the combined photosensitive and switching elements 4a described above.

In each of the above modifications, the photosensitive and switching elements may be formed on the opaque row conductors 5 so as to leave a maximum amount of each image area 10 free to be occupied by the transparent capacitor or capacitors 7.

It will be appreciated that other circuit arrangements and combinations of two-terminal photosensitive and switching elements may be used to form an image sensor in accordance with the invention.

Figure 6:
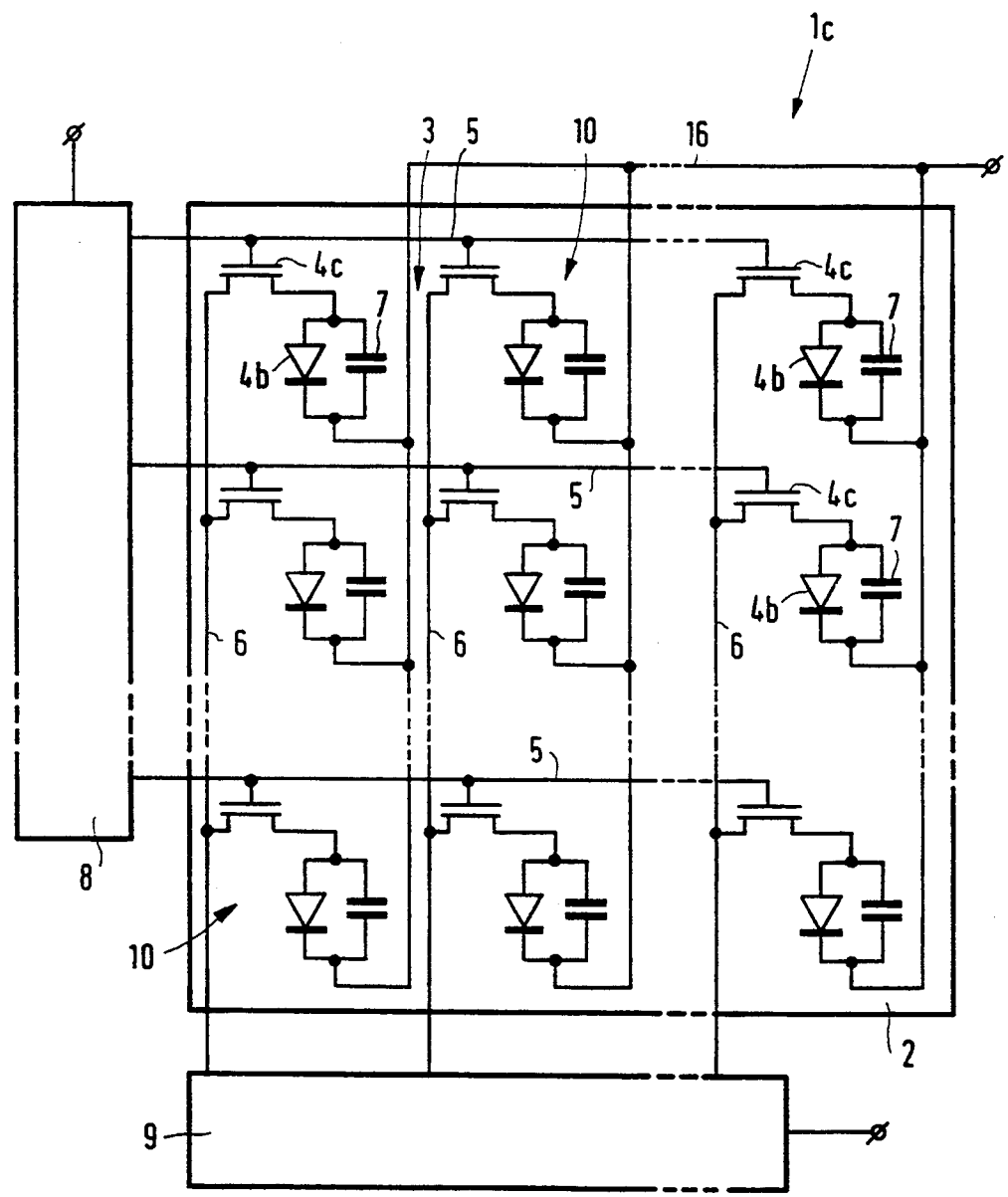
FIG. 6 is a schematic circuit layout of another example of an image sensor in accordance with the invention.

FIG. 6 illustrates another example of an image sensor 1c in which three-terminal switching elements, as shown thin film insulated gate field effect transistors (TFTs), 4c may be used in place of the two-terminal switching elements described above. In this case, the control or gate electrode of each TFT 4c is connected to a row conductor 5 while one of the main electrodes (in this case the source electrode) is connected to a column conductor 6. The other (drain) electrode of each TFT 4c is connected to the parallel arrangement of the photosensitive element 4b and capacitor 7. Again the photosensitive element 4b may, as shown, be a diode although other photosensitive elements such as a photosensitive resistor or diode-connected photosensitive TFT may be used. The anode of the photosensitive diode 4b is connected to a common line 16 which is connected to a reference potential.

In operation of the image sensor 1c, light incident on the photosensitive elements 4a is stored as charge on the capacitors 7. this charge is read-out via the column conductors 6 when the associated TFT 4c is rendered conducting by application of an appropriate switching signal to the appropriate row conductor 5.

Figure 7:
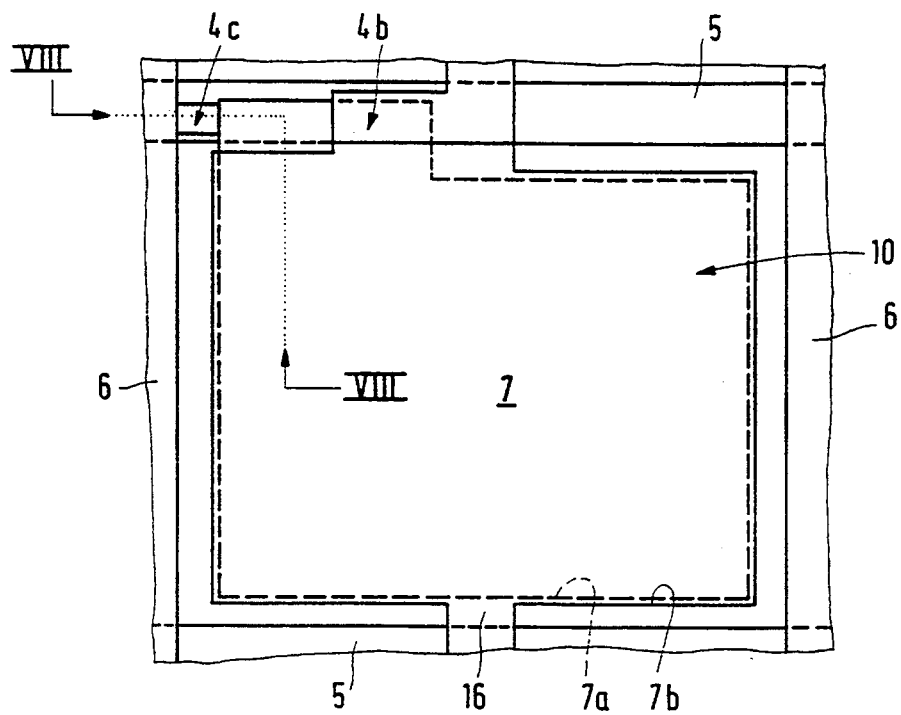
FIG. 7 is a schematic plan view of part of the image sensor shown in FIG. 6 but illustrating only the conductive levels so as to show the geometric relationship between various components.

FIG. 7 is a schematic plan view of the electrode layout of the image sensor 1c. The region of the TFT 4c is indicated generally by an arrowed line as is the region of the photosensitive diode 4b FIG. 8 is a cross-sectional view of such an image area 10 to show the structure of a TFT 4c.

Figure 8:
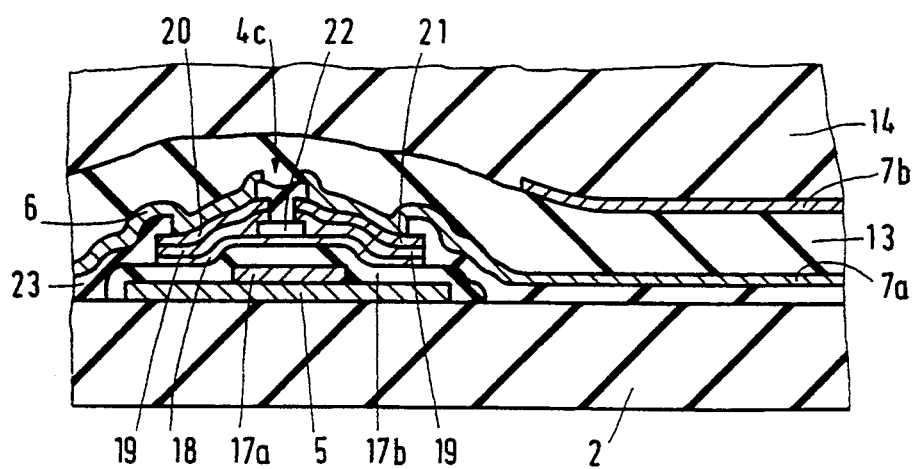
FIG. 8 is a cross-sectional view of part of the image sensor shown in FIG. 6 taken along the line VIII—VIII in FIG. 6.

As can be seen from FIGS. 7 and 8, in this case the TFT 4c may be formed on top of the row conductor 5 which forms the gate line connecting all the gates of a row of TFTs 4c. The TFT 4c shown in FIG. 8 is an inverted type B TFT having a generally chromium gate electrode 17a which may be provided directly on top of the row conductor 5.

Various layers are deposited and patterned to build up the TFTs 4c. Each TFT 4c has a gate insulating region 17b, generally formed of silicon dioxide or silicon nitride, covered by a channel-forming intrinsic semiconductor region 18, for example an amorphous or polycrystalline silicon region. Doped semiconductor regions 19 may be provided to define source and drain contact regions between the channel-forming region 18 and source and drain electrodes 20 and 21. A protective insulating layer 22 may be provided over the channel region.

A transparent insulating layer 23 generally of silicon dioxide or silicon nitride is provided over the surface of the structure and patterned to define windows to enable contact to be made to the source and drain electrodes 20 and 21. Metallization is then deposited and patterned to define the opaque column conductors 6 connecting the source electrodes of each TFT 4c in a column of TFTs and transparent, generally indium tin oxide (ITO), drain conductors which extend to form the bottom electrodes 7a of the capacitors 7.

A further transparent insulating layer 13 is provided over the structure followed by a further transparent, generally ITO, layer which provides, as an integral metallisation, the top electrodes 7b of the capacitors 7 and the common line 16. This is followed by a protective transparent passivating layer 14 which is generally a polyimide layer.

The photosensitive diodes 4b may be formed with the TFTs 4c or separately using appropriate masks to enable the respective device characteristics to be optimized. The photosensitive diodes 4b may have a structure similar to that shown in FIG. 5 where, of course, in this example the top electrode 7b of the capacitor also forms the common electrode 16.

Again, as in the examples described with reference to FIG. 1, the proportion of each image area 10 which can be occupied by the transparent capacitor 7, or may be free of components and thus transparent, can be increased by as described above providing the photosensitive and switching elements 4b and 4c on the row conductors 5.

Figure 9:
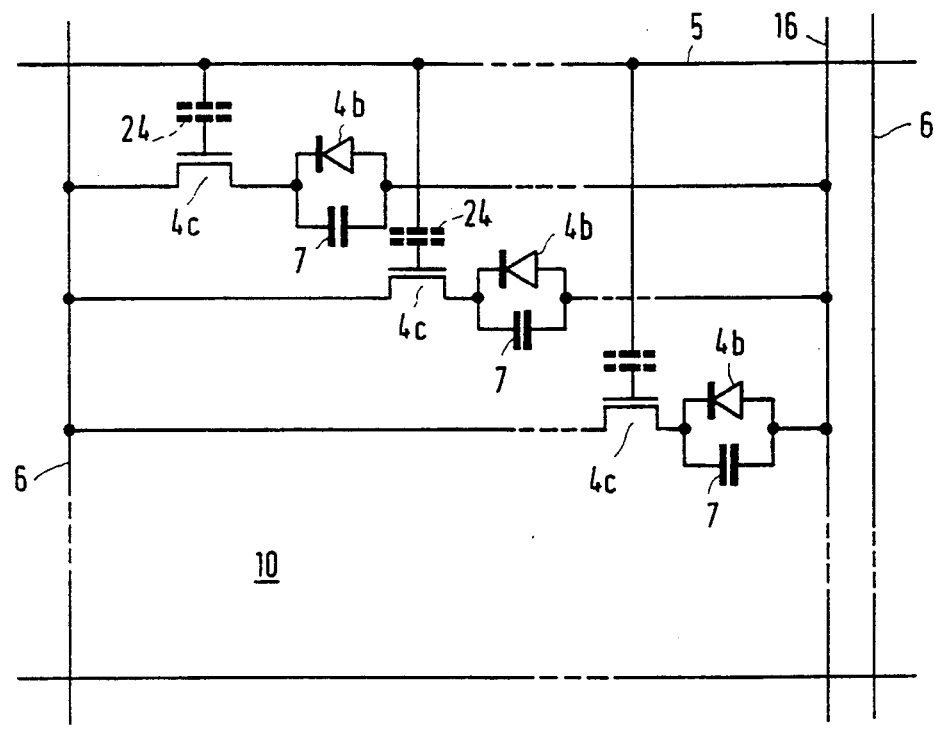
FIG. 9 is a schematic circuit layout of one image area of a modified version of the image sensor shown in FIG. 6.

FIG. 9 illustrates an image area 10 of a modified version 1d of the image sensor 1c. The image sensor 1d is related to the image sensor 1c in a similar manner as the image sensor 10 of FIG. 1 is related to the image sensor 1b of FIG. 4. Thus, in the image sensor 1d, each unique pair of row and column conductors 5 and 6 defining an image area 10 is associated with a number of photosensitive elements 4b each with its own switching element 4c. In this case the threshold adjusting means necessary to enable access, as described above in relation to FIG. 4, of individual photosensitive elements 4b adjusts the gate voltage necessary to turn on a particular TFT 4c. This may be achieved by using TFTs with different gate threshold voltages, by for example adjusting the gate insulating region thickness, or by the insertion between the gate electrode 17 and the row conductor 5 of a threshold adjusting device for example a capacitor 24 (shown in phantom lines in FIG. 9) or a diode or similar device. In other respects, the image sensor 1d is similar to the image sensor 1c. The image sensor 1d enables access of individual photosensitive elements 4b in a manner similar to that described above with reference to FIG. 4.

It will of course be appreciated that various different circuit configurations, be they diode switching or TFT switching arrangements, may be used. Moreover, the photosensitive and switching elements need not necessarily be provided on top of the row conductors 5 although this would necessarily reduce somewhat the proportion of each image area 10 which could be made transparent.

When each image area 10 is associated with a number of photosensitive elements 4, then these may be made sensitive to different wavelengths, for example by the incorporation of color filters in a manner similar to that known for electro-optic displays such as liquid crystal displays, so as to enable color image sensing.

The image sensors described above may be used, for example, to form an image of a document placed directly upon the transparent protective layer 14.

In each of the examples described above, charge stored on the capacitors 7 representing an image sensed by the photosensitive elements 4b is read out via the read-out amplifier 9 by accessing each photosensitive element 4b and the associated capacitor 7 individually as described above. The image signal data thus obtained may be supplied, for example, to a frame store for subsequent display on a display device such as a cathode ray tube or other electro optic display device for example a liquid crystal display device. Alternatively, the image signal data may be stored on an appropriate medium, WORM, RAM etc. for later use or may be subject to computer processing before storage or display.

As described above, an image sensor in accordance with the invention can be made very transparent, potentially in the region of 70 to 80% transparent. This enables the image sensor to be placed over or mounted on top of a display device while still enabling the display to be viewed. Such a display may be, for example, a cathode ray tube (CRT), a liquid crystal (LCD) or other electro-optic display or any other form of visual display (such as an instrumentation display panels using the image sensor as a convenient way of inputting data). If the transparent substrate 2 of the image sensor can be made of a flexible, for example plastics, material and enable the entire image sensor to have some degree of flexibility it may be possible to apply image sensor in accordance with the invention to a conventional CRT or other display having a curved surface. Also, with appropriate electronic circuitry of conventional type it may be possible to allow the data to be input to the display via, for example, a light pen or directly from a document placed on tile image sensor.

An image sensor in accordance with the present invention may have particular applications in relation to LCD or similar active matrix addressed displays. The usual form of a liquid crystal display device is well known and will not be described in detail here. Generally speaking the circuit layout of an active matrix addressed LCD display will be similar to that of the image sensor shown in FIG. 1 or FIG. 6 with of course several important differences. In particular, the photosensitive elements will generally be omitted and the capacitors, while present, will be those provided by the liquid crystal material and associated electrodes. The switching elements represented as diodes in FIG. 1 may in the case of an LCD display be any suitable form of non-linear switching device such as p-i-n diodes, MIMs etc.

In the case of a liquid crystal display the respective areas, corresponding to the image areas 10, bounded by the row and column conductors, are normally known as picture elements or pixels.

Figure 10:
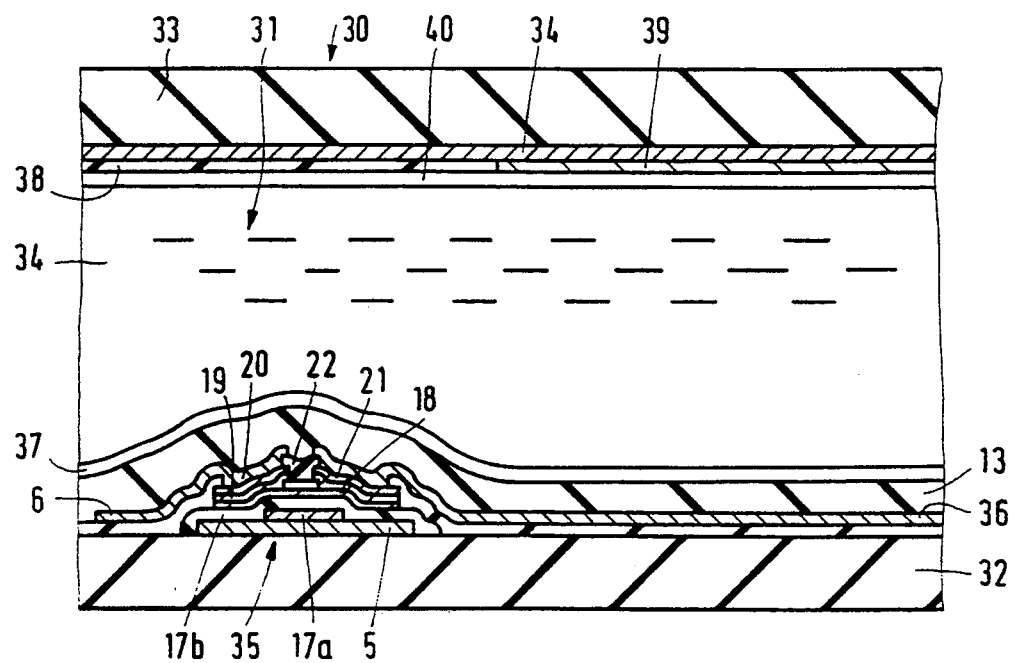
FIG. 10 is a cross-sectional view of a picture element area of a liquid crystal display device.

FIG. 10 is a cross-sectional view through one pixel 31 of a liquid crystal display device 30 having a TFT switching element based active matrix array. Generally, the circuit layout in this case will be similar to that shown for the image sensor in FIG. 6 except that, again, the photosensitive elements will generally be omitted and the capacitors represent the capacitances of the liquid crystal display elements.

For more detailed information on LCD displays reference made be made to, for example, U.S. Pat. No. 3862360 or a paper entitled 'Liquid Crystal Matrix Displays' by Lechner et al published in the Proceedings of the IEEE Vol. 59, No. 11, November 1971 at pages 1566–1579 or any readily available standard text.

The liquid crystal display 30 has two spaced-apart transparent, normally glass, substrates 32 and 33 defining therebetween a gap in which twisted nematic liquid crystal material 34 is disposed. Although not shown, polarizing layers are normally provided on the outer surfaces of the substrates 32 and 33.

The upper substrate 33 carries a transparent, generally ITO, electrode which forms the common electrode 34 of the picture elements 31. The lower substrate 32 carries the switching elements 35 which in this example are of similar structure to that described above with reference to FIG. 8 and will not be described further. The same reference numerals have been used in FIG. 10 as in FIG. 8. In this case, however, the ITO drain electrode of each TFT 35 extends to form a lower electrode 36 of the picture element and the passivating insulating layer 13 is covered by an orientation layer 37 of a polymer material.

The transparent common electrode 34 carries a light shield in the form of a matrix of light shielding areas 38 of insulative material which act to shield the switching elements 35 from scattered light or light incident on the upper substrate 32. The common electrode 34 may also carry a color filter layer 39 which defines a matrix of adjacent filter regions of red, green and blue filter material arranged in known manner so that the outputs from the corresponding group of three picture elements can combine to produce a color image. A further orientation layer 40 is provided between the liquid crystal material and the light shielding areas 38.

As described in, for example, GB-A-2198969 or EP-A-271960, each picture element 31 may be divided into subsidiary picture elements accessible by respective switching elements with some appropriate form of threshold adjusting device being provided to enable different subsidiary picture elements associated with the same pair of row and column conductors to be accessed individually by the use of different switching signals so as to improve the grey scale (or color resolution) of the image which can be produced by the display.

Figure 11:
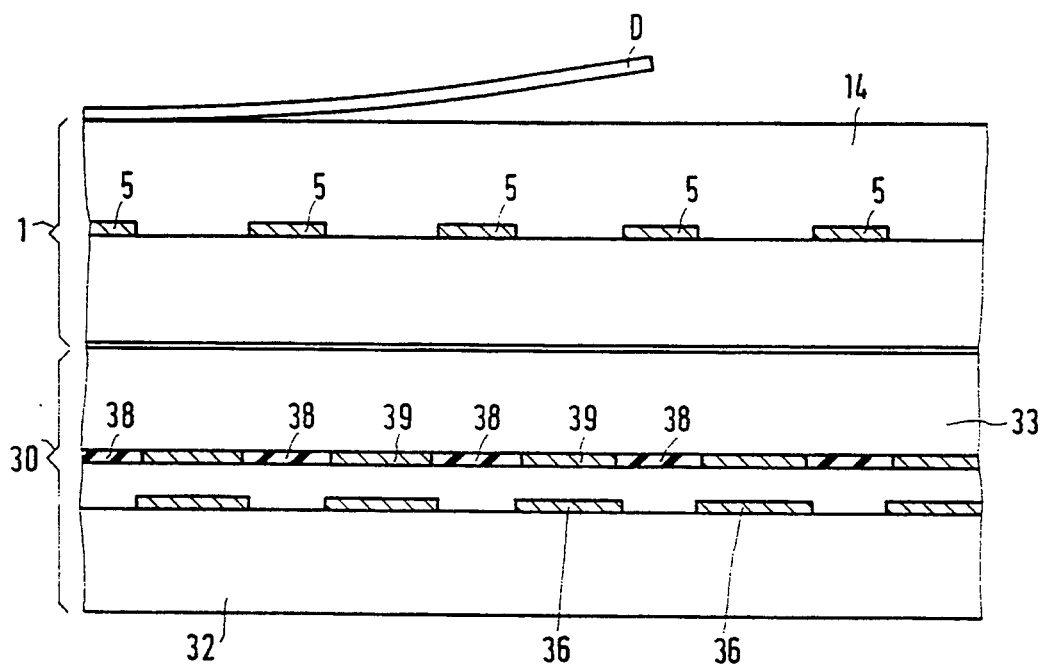
FIG. 11 is a cross-sectional view of a combined image sensor and display device in accordance with the invention.

An image sensor in accordance with the invention may be combined with an LCD display of the type described above. FIG. 11 illustrates schematically and in only the brief outline necessary for comprehension a cross-section through such a combined display and image sensor.

As shown in FIG. 11, the substrate 2 of an image sensor 1 (for example any of the ones described above with reference to FIGS. 1 to 9) in accordance with the invention is mounted directly on top of the upper substrate 33 of the LCD display 30 so that the LCD display has to be viewed through the image sensor 1. The substrates 2 and 33 may, if desired, be secured together by means of a suitable transparent adhesive or the image sensor 1 may be removably mounted on top of the display device 30. FIG. 11 shows a document D to be sensed being placed on top of the image sensor 1.

Because the LCD display 30 and image sensor I have similar active matrix addressing arrangements, the two device structures can be formed so that their row and column conductors are aligned and coincident. In particular, the opaque row conductors 5 of the image sensor 1 can be aligned with the light shield areas 38 of the LCD display. The display 30 may be secured to the image sensor 1 by means of, for example, a UV (ultra violet) curable epoxy resin and alignment may be achieved by, prior to UV exposure, flood illuminating the image sensor I with the back light of the display 30 and moving the image sensor I relative to the display 30 until a maximum light output (as detected by an appropriate meter) is achieved from the image sensor 1. This means that the opaque row conductors 5 do not obstruct or obscure any of the image displayed by the LCD display and because the image sensor 1a is otherwise almost completely transparent, any image displayed by the LCD display can be viewed in its entirety without any difficulty. The fact that the photosensitive elements 4a are provided on the opaque row conductors 5 means that the photosensitive elements are automatically shielded from the back illumination light source 0 of the liquid crystal display device.

The use of an image sensor such as those described above with reference to FIGS. 4 and 9 where a number of photosensitive elements are associated with the same pair of row and column conductors has particular advantages in that it enables the image sensor to have a resolution greater than the display device 30 to enable, for example, the reading or imaging of text, without having to have an increased number of row and column conductors which would otherwise reduce the transparency of the sensor and obscure part of the display.

With appropriate conventionally available circuitry, the image data signals read-out from the image sensor I may, possibly via an appropriate store such as a frame store, be supplied to the display device. This should enable the image sensor I to be used to 'write' on the display or to otherwise modify a displayed image using for example a light pen.

As indicated above it may be possible to make the image sensor sensitive to color so enabling writing in full color on a color LCD display.

Alternatively, a color LCD display could be used together with a 'grey scale' image sensor to enable the image sensor to sense a full color image by for example using the display to illuminate the sensor sequentially with red, green and blue light. The sets of image signals sensed by the image sensor 1 under each of these different color illuminations can then be read out sequentially via the read-out amplifiers and combined to produce a composite set of signals representing the full color image. This has the advantage that the image sensor itself need not be adapted for color sensing. It will of course be appreciated that photosensitive elements, such as amorphous silicon diodes, which are sensitive over the entire visible range should be used and that weighting factors may need to be incorporated when combining the signals to take account of the variation of quantum efficiency with wavelength. The image sensor may, as described above with reference to FIGS. 10 and 11 in conjunction with FIG. 4 or 9, have a higher resolution than the display because the light passing through the display is not strictly parallel but diverges and because generally the separation of the liquid crystal display plane and the imaging plane, as set by the thickness of the substrates at typically about 2 mm, is much greater than the pixel pitch which may be typically 200 μm (micrometres). This means that the divergence of the light emitted by the LCD display under each separate color illumination is such that the entire area of the document or object to be imaged is illuminated although only a third of the area of the display is generating the illumination.

Of course colors other than red, green and blue (for example white plus two primary or two secondary (cyan, megneta or yellow) colors or the three secondary colors could be generated by the display and used to provide such a full color sensor.

From reading the present disclosure, other modifications and variations will be apparent to persons skilled in the art. Such modifications and variations may involve other features which are already known in the semiconductor art and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

We claim:

1. An image sensor comprising a transparent substrate supporting a two dimensional array of photosensitive and switching elements with switching signal conductors and data signal conductors connected to the photosensitive and switching elements for enabling individual photosensitive elements to be accessed, the photosensitive and switching elements and conductors being arranged such that at least half of the area of the image sensor is transparent during operation, characterized in that each photosensitive element is electrically coupled to a respective capacitor for storing charge generated as a result of light being incident on the photosensitive element, the capacitors being formed so as to be transparent and so as to occupy a significant part of the entire area of the array.

2. An image sensor according to claim 1, wherein at least the switching signal conductors are opaque and the photosensitive elements are provided on the switching signal conductors so as to be shielded from the transparent substrate by the switching signal conductors.

3. An image sensor according to claim 1, wherein two or more photosensitive elements are associated with the same pair of switching signal and data signal conductors and are arranged to have different switching signal thresholds so that the two or more photosensitive elements can be accessed separately by applying different threshold switching signals to the switching signal conductor.

4. An image sensor according to claim 3, wherein the different switching signal thresholds are provided by connecting each of the two or more photosensitive elements to the associated switching signal conductor by separate switching elements having different switching thresholds.

5. An image sensor according to claim 4, wherein each switching element comprises a diode or a number of series-connected diodes.

6. An image sensor according to claim 4, wherein each switching element comprises an insulated gate field effect transistor and the transistors associated with difference ones of the two or more photosensitive elements have different threshold voltages.

7. An image sensor according to claim 4, wherein each switching element comprises an insulated gate field effect transistor and a respective voltage-adjusting element is provided between the gate electrode of the transistor and the switching signal conductor.

8. The combination of an electro-optic display device with an image sensor in accordance with claim 1, wherein the image sensor is mounted to the display surface of the display device so that an image provided by the display device is viewed through the image sensor.

9. The combination according to claim 8, wherein the electro-optic display device comprises an active matrix display device having a transparent substrate supporting a two-dimensional array of picture elements and signal conductors and data signal conductors for enabling individual picture elements to be accessed via associated switching elements and wherein the display device conductors are aligned with the corresponding conductors of the image sensor.

10. The combination according to claim 9, wherein the display device carries a mask for shielding the switching elements from incident light and the switching signal conductors of the image sensor are aligned with the mask.

11. The combination according to claim 8, wherein the electro-optic display device is a color display device.

12. A method of forming a color image sensor which method comprises providing an image sensor in accordance with claim 1 on a color display device, activating the color display device so as to illuminate an image being sensed by the image sensor sequentially with three different colors of light, reading out sets of signals from the image sensor representing the image as sensed under each different color illumination and combining the three sets of signals to produce a set of composite signals representing the full color image.

13. A method according to claim 12, which further comprises illuminating the image with red, green and blue light in any desired sequence.

14. An image sensor comprising a transparent substrate supporting a two dimensional array of photosensitive and switching elements and switching signal conductors and data signal conductors connected to the photosensitive and switching elements for enabling individual photosensitive elements to be accessed, the photosensitive and switching elements and conductors being arranged such that a substantial part of the area of the image sensor is transparent, the switching signal conductors being opaque and the photosensitive and switching elements being provided on the switching signal conductors so as to be shielded from the transparent substrate characterized in that two or more photosensitive elements are associated with the same pair of switching signal and data signal conductors and are arranged to have different switching signal thresholds so that the two or more photosensitive elements can be accessed separately by applying different threshold switching signals to the switching signal conductor.

* * * * *